(12) United States Patent
Pinna et al.

(10) Patent No.: US 7,304,592 B2
(45) Date of Patent: Dec. 4, 2007

(54) METHOD OF ADDING A DITHER SIGNAL IN OUTPUT TO THE LAST INTEGRATOR OF A SIGMA-DELTA CONVERTER AND RELATIVE SIGMA-DELTA CONVERTER

(75) Inventors: Carlo Pinna, Milan (IT); Sergio Pernici, Bergamo (IT); Angelo Nagari, Cilavegna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 11/420,592

(22) Filed: May 26, 2006

(65) Prior Publication Data

US 2006/0267823 A1 Nov. 30, 2006

(30) Foreign Application Priority Data

May 27, 2005 (EP) .................................. 05425374

(51) Int. Cl.
*H03M 3/00* (2006.01)
(52) U.S. Cl. ....................................... 341/143; 341/155
(58) Field of Classification Search ................ 341/143, 341/155, 131, 172, 122, 144
See application file for complete search history.

(56) References Cited

U.S. PATENT DOCUMENTS

| 5,055,846 A | 10/1991 | Welland | 341/155 |
| 5,835,038 A * | 11/1998 | Nakao et al. | 341/131 |
| 5,905,453 A | 5/1999 | Kase | 341/143 |
| 6,184,811 B1 | 2/2001 | Nagari et al. | 341/143 |
| 6,326,911 B1 * | 12/2001 | Gomez et al. | 341/143 |
| 6,462,685 B1 | 10/2002 | Korkala | 341/131 |
| 7,042,375 B1 * | 5/2006 | van Engelen | 341/131 |

FOREIGN PATENT DOCUMENTS

EP 0515154 11/1992

OTHER PUBLICATIONS

Sugitani et al., Improvement of Performances of SC Sigma-Delta Modulators, IEICE Transactions on Fundamentals of Electronics, Communications and Computer Sciences, Institute of Electronics Information and Comm. Eng. Tokyo, Japan, vol. 76A, No. 6, Jun. 1, 1993, pp. 931-938.

Vleugels et al., A 2.5-V Sigma-Delta Modulator for Broadband Communications Applications, IEEE Journal of Solid-State Circuits, IEEE Inc., New York, US, vol. 36, No. 12, Dec. 2001, pp. 1887-1899.

Rombouts et al., Design of Double-Sampling $\Sigma\Delta$ Modulation A/D Converters with Bilinear Integrators, IEEE Transactions on Circuits and Systems I: Fundamental Theory and Applications, vol. 52, No. 4, Apr. 2005, pp. 715-722.

* cited by examiner

*Primary Examiner*—Peguy JeanPierre
(74) *Attorney, Agent, or Firm*—Lisa K. Jorgenson; Allen, Dyer, Doppelt, Milbrath & Gilchrist, P.A.

(57) ABSTRACT

A single-ended or differential single-stage, or multi-stage sigma-delta analog-to-digital converter includes at least one switched-capacitor integrator comprising a switched-capacitor network receiving as input a signal to be sampled, and an amplifier coupled in cascade to the switched-capacitor network. A circuit is coupled to the amplifier for feeding an analog dither signal to a virtual ground of the amplifier.

24 Claims, 6 Drawing Sheets

METHOD OF ADDING A DITHER SIGNAL IN OUTPUT TO THE LAST INTEGRATOR OF A SIGMA-DELTA CONVERTER AND RELATIVE SIGMA-DELTA CONVERTER

FIELD OF THE INVENTION

The present invention relates to sigma-delta converters, and more particularly, to a method for adding a dither signal to an output of the last integrator of a sigma-delta converter, and to a corresponding single-ended or differential sigma-delta converter.

BACKGROUND OF THE INVENTION

Quantization noise of a sigma-delta converter is not white, but it is correlated with the input of the converter. For DC inputs, the quantization error is periodic and causes phenomena commonly referred to as idle channel tones or pattern noise. Its spectrum contains discrete tones, the frequencies and amplitudes of which depend upon the input level.

This noise may be schematically described as a sequence of pulses or a saw-tooth waveform. It has a very high peak-to-RMS (Root Mean Square) ratio, and is periodic. The periodic patterns of the quantization error may cause audible noise when sigma-delta modulators are used in audio applications.

Moreover, sigma-delta converters may generate very high-powered tones near one half the switching frequency $f_s/2$ of the converter. Therefore, they are susceptible to being demodulated in the baseband.

To remove or attenuate the above phenomena, a technique called dithering has been devised and implemented in sigma-delta converters. The dithering technique adds a dither signal, which is a random (or pseudo-random) signal, in the sigma-delta converter loop to remove or attenuate any kind of residual periodicity in the quantization noise.

Several techniques, as recalled below, have been implemented to realize the dithering in sigma-delta converters:

a) Out-of-band sine or square waves [1] [2]. This technique is easily implemented, but requires large signals and limits the dynamic range of the converter. Moreover, the signals need to be filtered and preferably their frequency is irrational. This is relatively hard to do.

b) DC offset [3]. This technique is easily implemented, but is not very reliable because eventual DC inputs are susceptible to canceling the dither signal. Moreover, the effects of the DC offset depend from the initial conditions of the modulator.

c) Small digital noise input to the D/A converter included in any analog-to-digital sigma-delta converter [4]. This technique is easily implemented, but is not effective because the dither signal needs to be very large.

d) Small analog circuit noises injected in the feedback loop of the A/D converters [5]. This technique is easily implemented while respecting the specifications of the converter, but is not efficient because the dither signals need to be relatively large.

e) Pseudo-random noise (dither signal) input to the quantizer [6]. This technique is not easily implemented. Moreover, the dither signal needs to be correlated to the least significant bit of the quantizer. This technique is very effective if the least significant bit of the dither signal is distributed according to a rectangular probability density function, or the two least significant bits of the dither signal are distributed according to a triangular probability density function.

A block diagram of a generic second-order sigma-delta converter with addition of a dither signal, disclosed in the articles by S. Pernici et al., "A 1.8V 14b Audio Front End CODEC for Digital Cellular Phones"—Digest of ISSCC 1999 and by S. Norsworthy, R. Schreier, G. Temes, "Delta-Sigma Data Converters"—IEEE Press, is shown in FIG. 1. This architecture is used especially in high-quality audio applications, and its effectiveness depends upon the number N of bits of the digital-to-analog converter of the dither signal. Usually, a digital-to-analog converter with eight output levels (N=3) is employed.

Many references disclosing different architectures of digital-to-analog converters or sources of a dither signal, which is substantially a pseudo-random noise signal, are available in the literature. The feedback shift-register architecture depicted in FIG. 1 is probably the most used.

A sigma-delta converter including a circuit for generating a dither signal, the amplitude of which is inversely proportional to the amplitude of a signal in input to the converter, is disclosed in U.S. Pat. No. 6,462,685.

Typically, sigma-delta converters include an adder in cascade to the last integrator of the converter for adding the dither signal to a signal to be quantized by the output quantizer of the sigma-delta converter, as schematically depicted in FIG. 2 for a differential converter. Unfortunately, this approach implies a relatively large area of silicon to be occupied.

In U.S. Pat. No. 5,905,453, a sigma-delta analog-to-digital converter with a dithering circuit is disclosed. Differently from the architectures of FIGS. 1 and 2, the dither signal is added to the input of the last integrator using a dedicated array of switched capacitors. This architecture does not overcome the drawbacks of the converter of FIG. 1 because it requires additional switches for connecting the additional capacitors alternately to the input of the last integrator and to a common ground node.

SUMMARY OF THE INVENTION

In view of the foregoing background, an object of the present invention is to provide a method for adding a dither signal at the output of the last integrator of a single-stage or multi-stage sigma-delta converter while overcoming the above-mentioned drawbacks.

A sigma-delta converter comprises one or a plurality of integrators in cascade, each comprising an operational amplifier in cascade to a switched-capacitor structure.

The dither signal may be added without requiring any dedicated circuit, thus saving a relatively large silicon area. This may be done by feeding the dither signal to a virtual ground node of the amplifier of the last integrator (in the cascade). The last integrator is the integrator that generates the signal that is applied as an input to the output quantizer of the sigma-delta converter.

According to the invention, the analog dither signal may be generated by a digital-to-analog converter (DAC) input with a digital dither signal, and the output of the DAC may be connected to the virtual ground node of the amplifier of the last switched-capacitor integrator. This results in an amplified replica of the analog dither signal being effectively added to the output of the integrator.

The gain in which the analog dither signal is amplified may depend upon the ratio between the feedback capacitor of the integrator, and the total capacitance of the DAC.

More precisely, a single-ended or differential single-stage or a multi-stage sigma-delta analog-to-digital converter comprises at least one switched-capacitor integrator having a switched-capacitor network that receives as input a signal to be sampled, and an amplifier in cascade thereto. Circuit means or a circuit is coupled to the amplifier for providing the analog dither signal to the virtual ground node of the amplifier.

A multi-stage differential sigma-delta converter may include two identical digital-to-analog converters feeding a differential analog replica of a digital dither signal to the differential virtual ground node of the differential amplifier of the last integrator in the cascade of integrators of the converter.

BRIEF DESCRIPTION OF THE DRAWINGS

The invention will be described referring to the attached drawings, wherein.

DETAILED DESCRIPTION OF THE PREFERRED EMBODIMENTS

Figure 1:
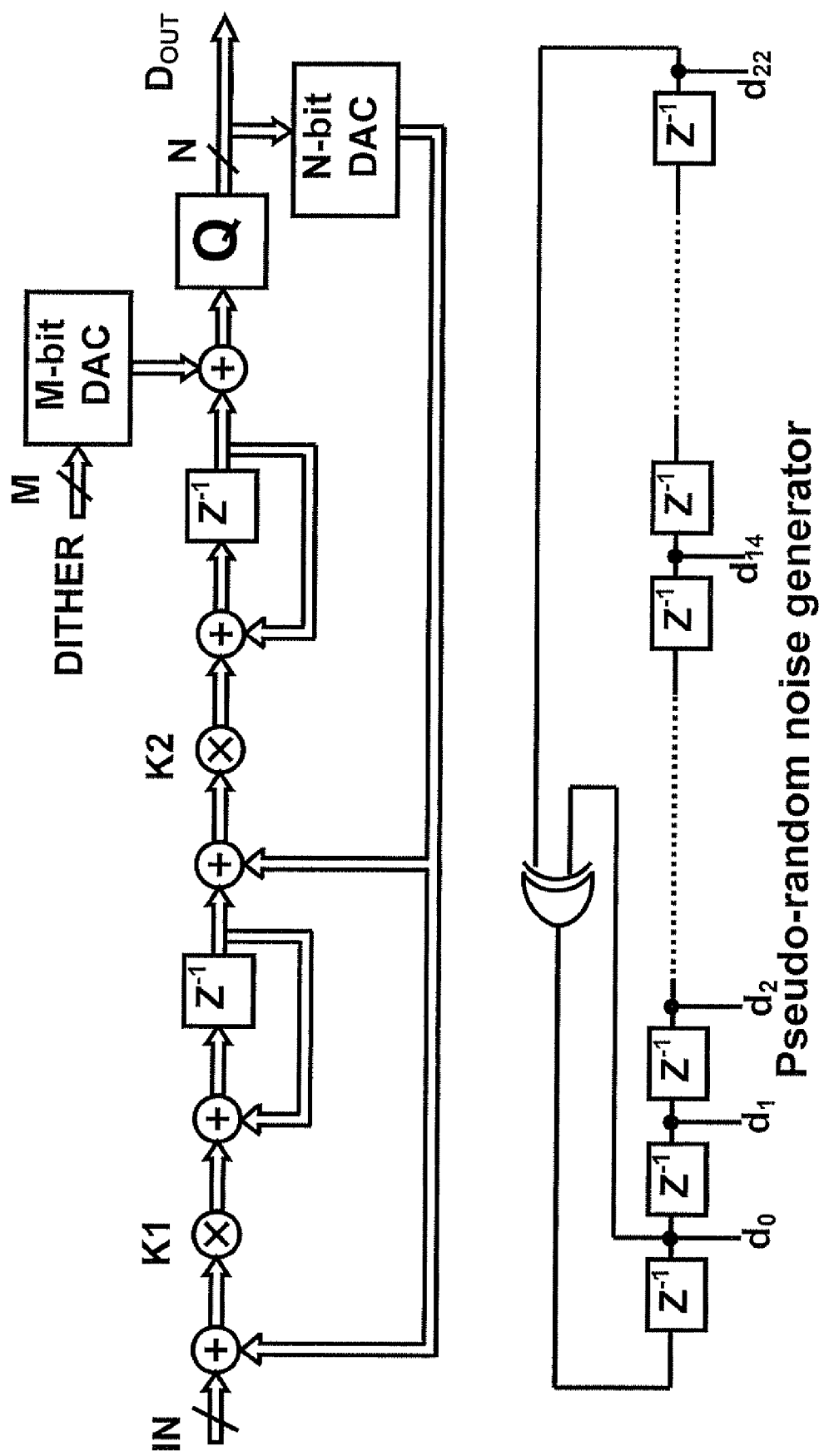
FIG. 1 is a block diagram of a sigma-delta converter in accordance with the prior art.
Figure 2:
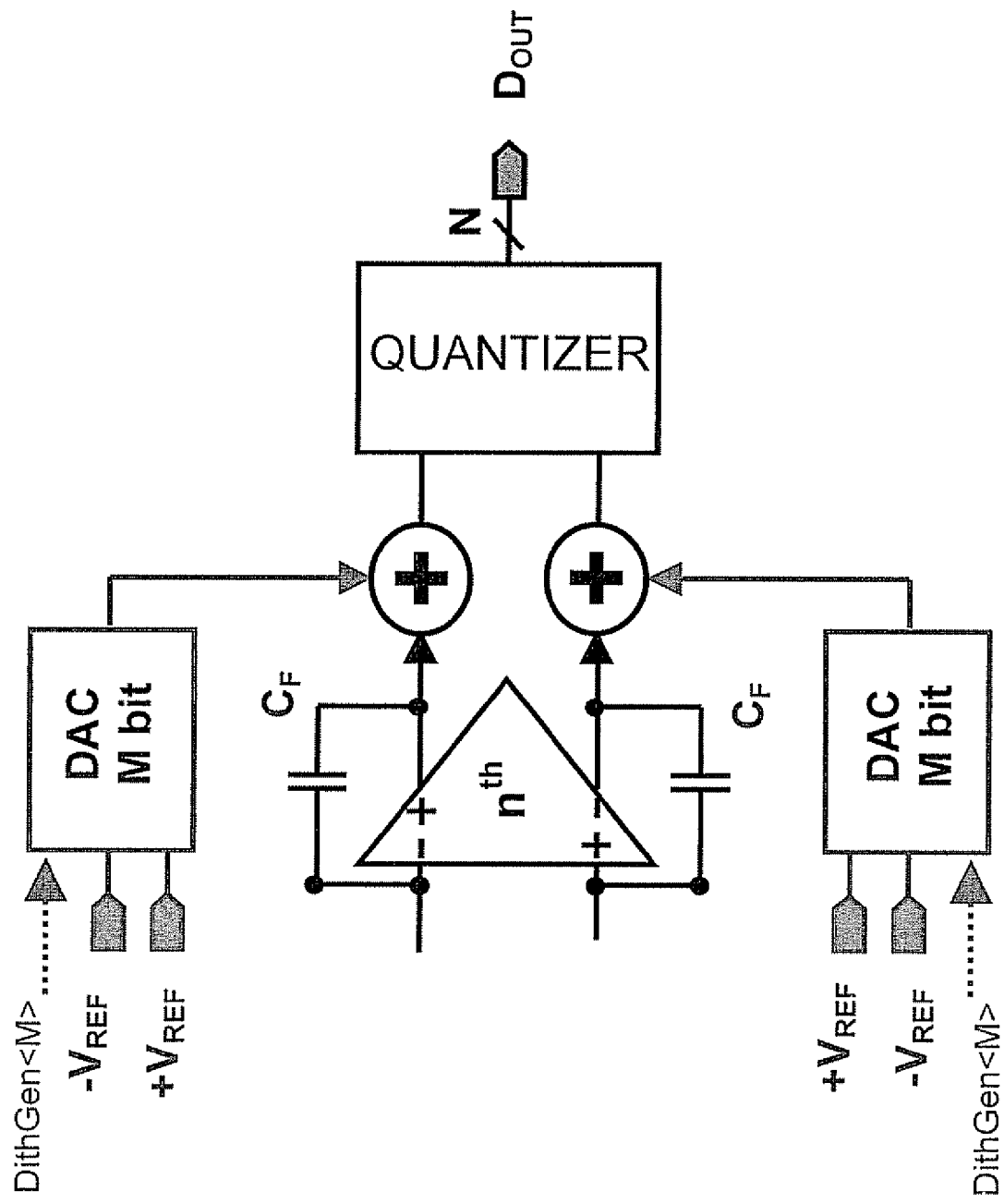
FIG. 2 is a block diagram of the last stage of a differential sigma-delta converter in accordance with the prior art.
Figure 3:
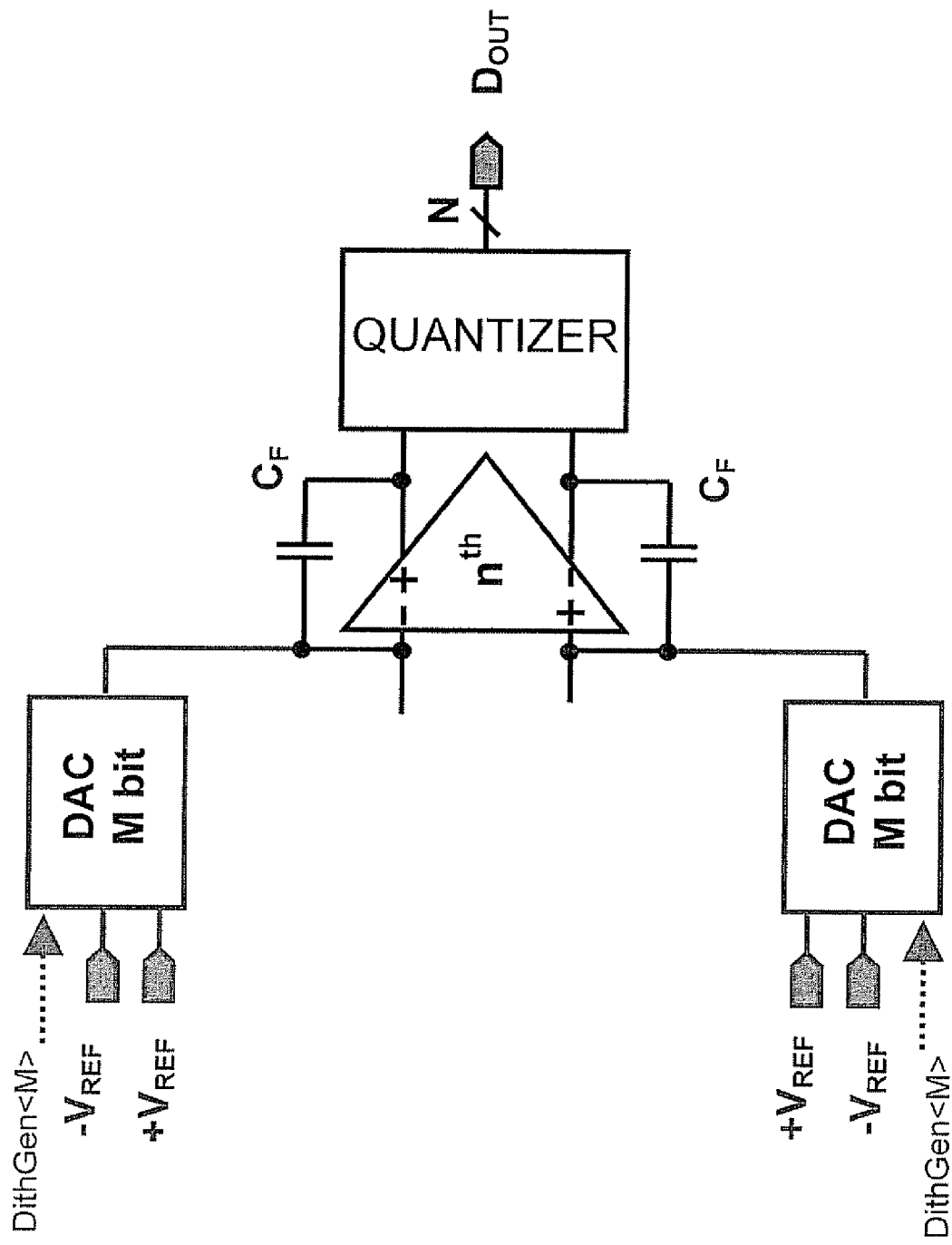
FIG. 3 is a block diagram of the last stage of a differential sigma-delta converter in accordance with the present invention.

A basic scheme of the last integrator of a multi-bit differential sigma-delta converter in accordance with the present invention is depicted in FIG. 3. Differently from the circuit of FIG. 2, this architecture does not include adders in cascade with the integrator. Nevertheless, an amplified analog replica of an externally generated digital dither signal is effectively added to the output of the integrator.

Figure 6:
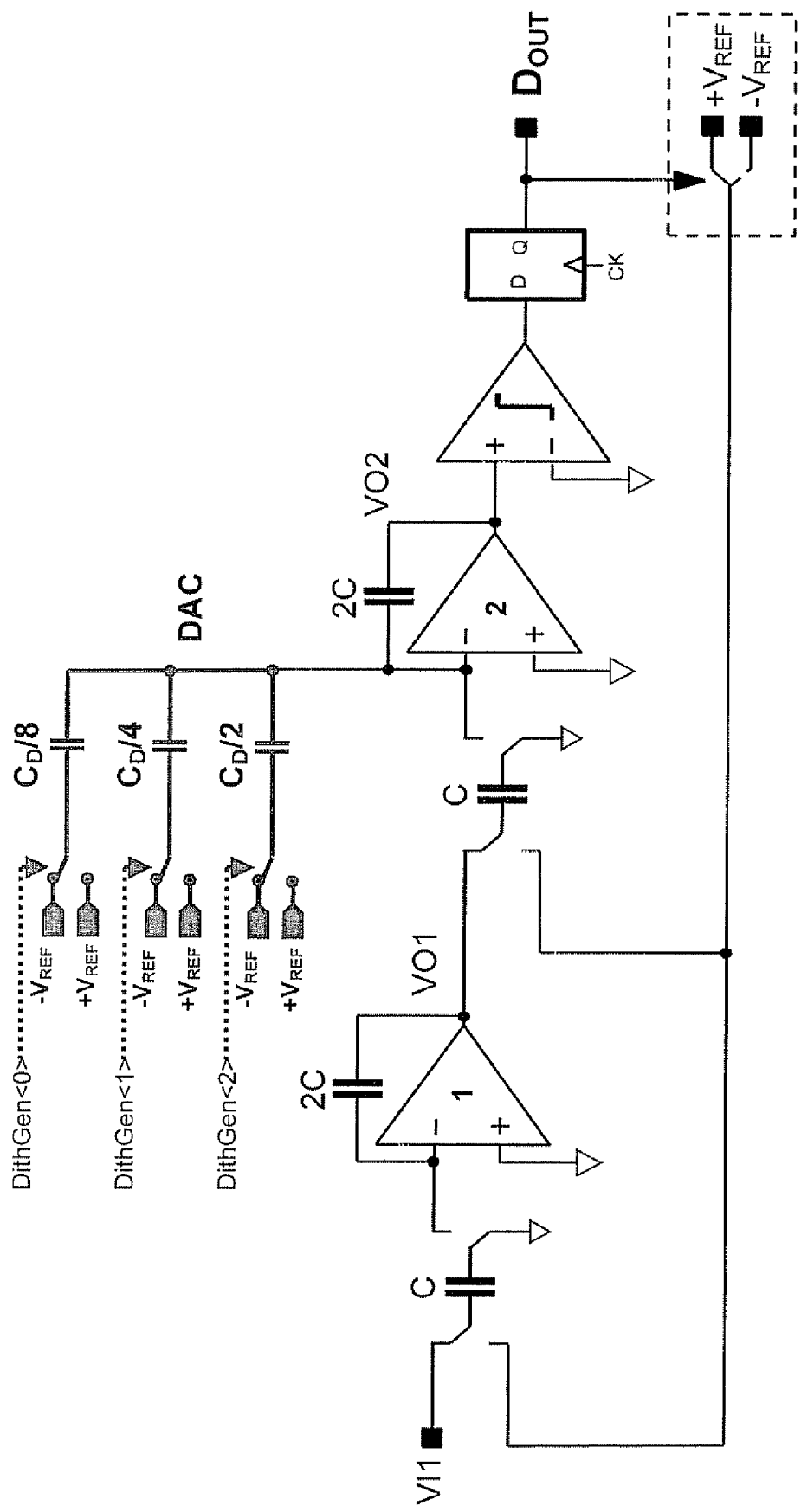
FIG. 6 is a detailed view of a single-bit single-ended sigma-delta converter in accordance with the present invention.

According to the method of the invention, the dither signal is added to the output of the last integrator by feeding it to the virtual ground node of the integrator. In a differential integrator, this may be done by feeding an analog replica of the dither signal to both inputs of the integrator. In a single-ended converter, this is done by feeding the analog dither signal to the input of the amplifier to which the integrating capacitor 2C is connected, as shown in FIG. 6.

Figure 4:
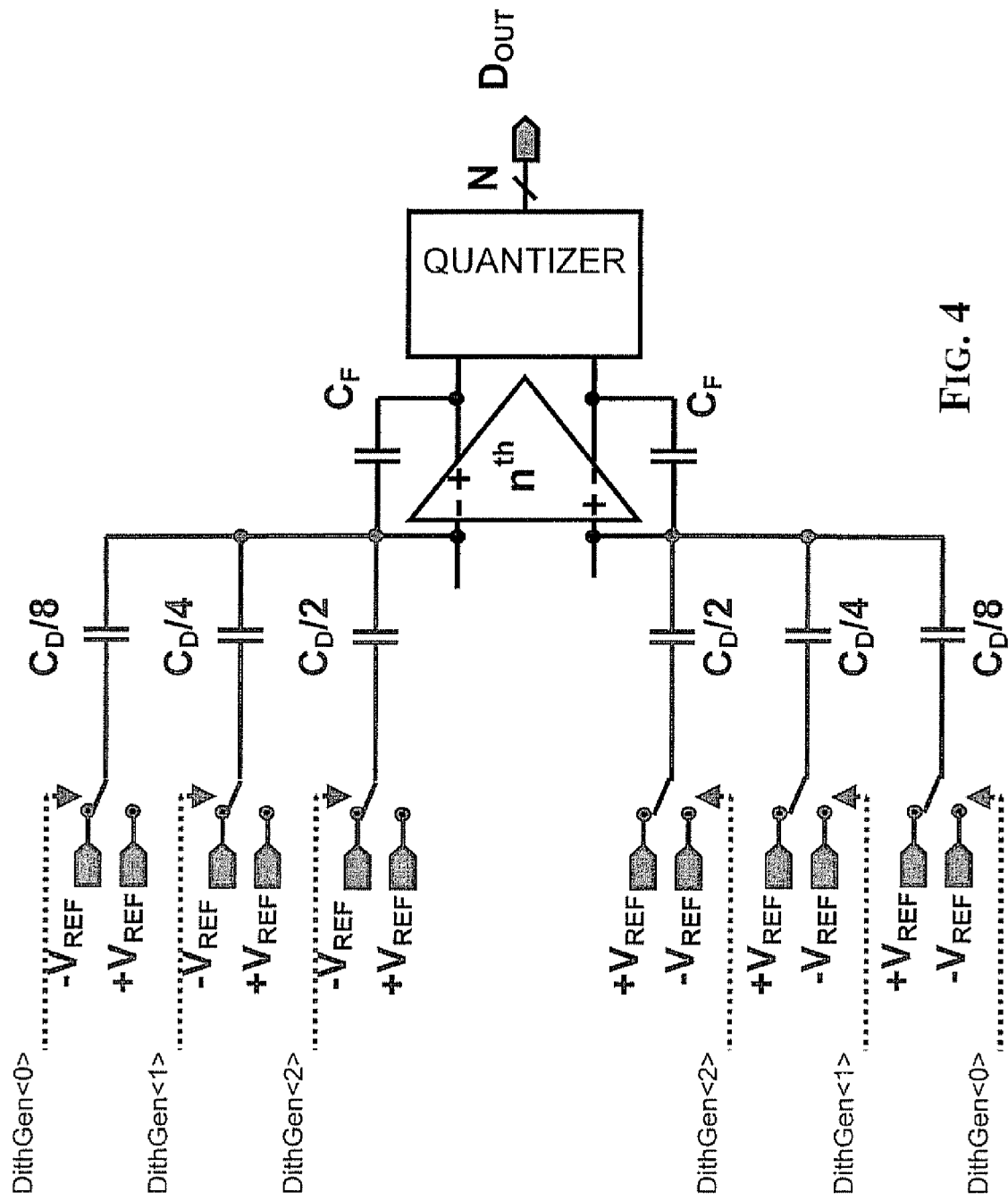
FIG. 4 is a detailed view of the circuit of FIG. 3.

According to another aspect of the invention, each digital-to-analog converter DAC may be conveniently formed with an array of binary weighted capacitors as shown in FIG. 4, connected to a pre-established positive $+V_{REF}$ or negative $-V_{REF}$ reference voltages (usually generated by voltage generators external to the converter) depending on the bits $D_{ITH}G_{EN}$ of an externally generated digital dither signal. The common node of the array of capacitors is connected to both input nodes of the amplifier, thus the virtual ground potential of the integrator varies in accordance with the dither signal.

Figure 5:
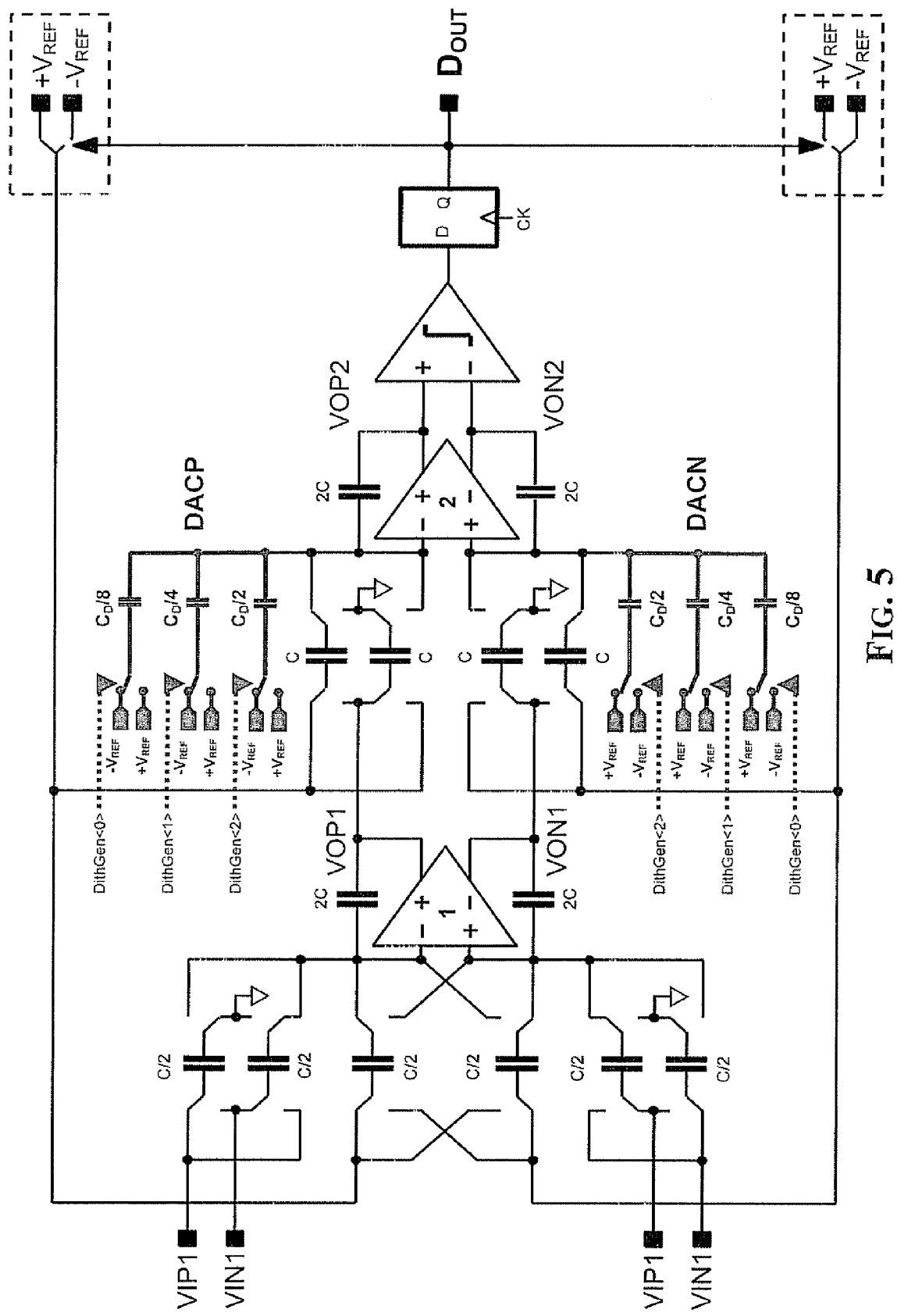
FIG. 5 is a detailed view of a single-bit differential sigma-delta converter in accordance with the present invention.

A detailed view of an embodiment of a differential single-bit two-stages sigma-delta analog-to-digital converter in accordance with the invention is depicted in FIG. 5.

A differential input signal VIN1, VIP1 to be converted is sampled by a first bilinear double-sampled switched-capacitor integrator that generates an intermediate differential signal VOP1, VON1 that is input to the successive and last (in the example shown) integrator in the cascade.

Preferably, the capacitance $C_D$ is half the capacitance C of each of the four capacitors of the bilinear double-sampled switched capacitor structure of the last integrator.

The shown differential converter retains the same advantages of the sigma-delta converter of U.S. Pat. No. 6,184,811 but in addition benefits from the advantages of the dithering technique. The '811 patent is incorporated herein by reference in its entirety, and is assigned to the current assignee of the present invention.

Of course, a sigma-delta converter of the invention may have a single stage or even more than two stages, provided that the analog replica of the dither signal be fed to the virtual ground node of the last integrator in the cascade.

Moreover, as it will be apparent to those skilled in the art, the digital output may even be a multi-bit signal, as indicated in FIGS. 3 and 4, provided that a multi-bit quantizer is employed and the feedback digital-to-analog converters of the output signal DOUT are appropriate for generating an analog replica of a multi-bit digital signal.

Usually, single-ended sigma-delta converters are less preferred than differential converters. However, the method of the invention is applicable even to single-ended converters. A single-ended single-sampled sigma-delta converter of the invention is shown in FIG. 6. The functioning of this converter is readily understood by those skilled in the art in light of what has been already been stated while referring to the differential converter of FIG. 5.

The main advantages of sigma-delta converters of the invention are:

1) dither functionality unchanged: the dither signal is added without affecting the transfer function of the converter nor the dither transfer function;

2) DAC gain: it is determined by the ratio of the capacitance $C_D$ and the sigma-delta last integrator feedback capacitance C of the integrator to which the dither signal is input, therefore the amplification gain of the dither signal may be determined more precisely than in any other non-capacitive implementation;

3) no extra components are needed, besides the dither DAC capacitive array, which occupies a negligible silicon area; and 4) the input of the quantizer is not crowded by dedicated circuitry for the injection of dither signal, and the performances of the sigma-delta converter are not degraded by the dither signal.

The performances of the sigma-delta converter of FIG. 5 are:

a) baseband tones are eliminated;

b) stronger attenuation (up to 20 dB) compared to known converters, of tones near half the switching frequency $f_S/2$ of the switches of the switched-capacitor networks;

c) the peak-to-RMS ratio of the noise is greatly reduced;

d) the noise is substantially white and constant for all types of inputs, therefore, the SNR (Signal-to-Noise Ratio) is significantly improved in respect to the case of absence of the dither signal;

e) AC linearity is improved, the dither signal uncorrelates the noise for low-level AC inputs as well as for DC inputs; and f) small loss of dynamic range (Signal-to-Noise+Total Harmonic Distortion ratio) at the maximum amplitude range.

REFERENCES

[1] Y. Matsuya, et al., "A 16-bit oversampling A/D conversion technology using triple-integration noise shaping" *IEEE Journal of Solid-State Circuit,* vol. 28, pp.648-660, June 1993.
[2] B. Leung, et al., "Area-efficient multichannel oversampled PCM voice-band coder" *IEEE Journal of Solid-State Circuit,* vol. 23, pp. 1351-1357, December 1988
[3] J. C. Candy, et al., "The structure of quantization noise from sigma-delta modulation" *IEEE Transaction on Communication,* vol. 29, pp. 1316-1323, September 1981.
[4] I. Galton, "One-bit dithering in delta-sigma modulator-based D/A converter" *IEEE Proc. ISCAS'93,* pp. 1310-1313, May 1993.
[5] T. Okamoto, et al., "A 16-bit oversampling CODEC with filtering DSP" *ISSCC Dig. Tech. Pap.,* pp. 74-75, February 1991.
[6] D. Welland, "Method for tone avoidance in delta-sigma converter", U.S. Pat. No. 5,055,846, assigned to Crystal Semiconductor.

That which is claimed:

1. A sigma-delta analog-to-digital converter comprising:
at least one switched-capacitor integrator comprising
a switched-capacitor network receiving as an input a signal to be sampled, and
an amplifier coupled in cascade to said switched-capacitor network; and
a dither circuit coupled to said amplifier and comprising at least one digital-to-analog converter (OAC) receiving at least one externally generated digital dither signal for feeding at least one analog dither signal to said amplifier.

2. The sigma-delta analog-to-digital converter according to claim 1, wherein said amplifier includes a virtual ground; and wherein the at least one analog dither signal is applied to the virtual ground of said amplifier.

3. The sigma-delta analog-to-digital converter according to claim 1, wherein said switched-capacitor network comprises a double-sampled switched-capacitor structure.

4. The sigma-delta analog-to-digital converter according to claim 1, wherein said switched-capacitor network comprises a single-sampled switched-capacitor structure so that the sigma-delta analog-to-digital converter is configured as a single-ended converter.

5. The sigma-delta analog-to-digital converter according to claim 1, wherein said amplifier includes a pair of inputs; and wherein said dither circuit comprises two identical digital-to-analog converters (DAC) so that the sigma-delta analog-to-digital converter is configured as a differential converter, said two identical DACs receiving externally generated digital dither signals, and generating two identical analog dither signals and feeding them to the pair of inputs of said amplifier; and wherein said switched-capacitor network comprises a double-sampled switched-capacitor structure.

6. The sigma-delta analog-to-digital converter according to claim 5, wherein said amplifier includes a pair of outputs; wherein said at least one switched-capacitor integrator comprises two identical feedback capacitors each connected between respective inputs and outputs of said amplifier; wherein the double-sampled switched-capacitor structure comprises four identical capacitors, a capacitance of which is half a capacitance of said feedback capacitors; and wherein each DAC comprises an array of binary weighted capacitors, a largest capacitance of said array of binary weighted capacitors being a fraction of the capacitance of said four identical capacitors.

7. The sigma-delta analog-to-digital converter according to claim 6, wherein the largest capacitance of said array of binary weighted capacitors is four times smaller than a capacitance of said four identical capacitors.

8. The sigma-delta analog-to-digital converter according to claim 6, further comprising:
an input integrator distinct from said at least one switched-capacitor integrator;
a double sampled bilinear switched capacitor network so that the sigma-delta analog-to-digital converter is configured as a second-order double-sampled analog-to-digital sigma-delta converter, said doubled sampled bilinear switched capacitor network including two pairs of differential inputs for receiving an analog differential input to be double-sampled; and
said input integrator generating a differential signal forming the input signal to said switched-capacitor network of said at least one switched-capacitor integrator, and further comprising at least one negative feedback digital-to-analog converter for feeding an analog replica of a digital output of the converter to dedicated pairs of inputs of said input integrator for double-sampling the analog replica.

9. A sigma-delta converter comprising:
at least one switched-capacitor integrator comprising
a switched-capacitor network receiving as an input a signal to be sampled, and
an amplifier coupled to said switched-capacitor network; and
at least one digital-to-analog converter (DAC) coupled to said amplifier and receiving at least one externally generated digital dither signal for feeding at least one analog dither signal to said amplifier.

10. The sigma-delta converter according to claim 9, wherein said amplifier includes a virtual ground; and wherein the at least one analog dither signal is applied to the virtual ground of said amplifier.

11. The sigma-delta converter according to claim 9, wherein the at least one dither signal is fed to a virtual ground of said amplifier is an analog dither signal; and wherein said switched-capacitor network comprises a double-sampled switched-capacitor structure.

12. The sigma-delta converter according to claim 9, wherein said switched-capacitor network comprises a single-sampled switched-capacitor structure so that the sigma-delta converter is configured as a single-ended converter.

13. The sigma-delta converter according to claim 9, wherein said amplifier includes a pair of inputs; and wherein said at least one DAC comprises two identical DACs so that the sigma-delta converter is configured as a differential converter, said two identical DACs receiving externally generated digital dither signals, and the at least one dither signal comprises two identical analog dither signals that are feed to the pair of inputs of said amplifier; and wherein said switched-capacitor network comprises a double-sampled switched-capacitor structure.

14. The sigma-delta converter according to claim 13, wherein said amplifier includes a pair of outputs; wherein said at least one switched-capacitor integrator comprises two identical feedback capacitors each connected between respective inputs and outputs of said amplifier; wherein said double-sampled switched-capacitor structure comprises four identical capacitors, a capacitance of which is half a capacitance of said feedback capacitors; and wherein each DAC comprises an array of binary weighted capacitors, a largest capacitance of said array of binary weighted capacitors being a fraction of the capacitance of said four identical capacitors.

15. The sigma-delta converter according to claim 14, wherein the largest capacitance of said array of binary weighted capacitors is four times smaller than a capacitance of said four identical capacitors.

16. The sigma-delta converter according to claim 14, further comprising:
   an input integrator distinct from said at least one switched-capacitor integrator;
   a double sampled bilinear switched capacitor network so that the sigma-delta converter is configured as a second-order double-sampled sigma-delta converter, said doubled sampled bilinear switched capacitor network including two pairs of differential inputs for receiving an analog differential input to be double-sampled; and
   said input integrator generating a differential signal forming the input signal to said switched-capacitor network of said at least one switched-capacitor integrator, and further comprising at least one negative feedback digital-to-analog converter for feeding an analog replica of a digital output of the converter to dedicated pairs of inputs of said input integrator for double-sampling the analog replica.

17. A method for operating a sigma-delta analog-to-digital converter comprising at least one switched-capacitor integrator having a switched-capacitor network and an amplifier coupled to the switched-capacitor network; and a dither circuit coupled to the amplifier, the method comprising:
   sampling an input signal received by the switched-capacitor network; and
   using the dither circuit comprising at least one digital-to-analog converter (DAC) for receiving at least one externally generated digital dither signal for feeding at least one analog dither signal to the amplifier.

18. The method according to claim 17, wherein the amplifier includes a virtual ground; and wherein the at least one analog dither signal is applied to the virtual ground of the amplifier.

19. The method according to claim 17, wherein the switched-capacitor network comprises a double-sampled switched-capacitor structure.

20. The method according to claim 17, wherein the switched-capacitor network comprises a single-sampled switched-capacitor structure so that the sigma-delta analog-to-digital converter is configured as a single-ended converter.

21. The method according to claim 17, wherein the amplifier includes a pair of inputs; and wherein the dither circuit comprises two identical digital-to-analog converters (DAC) so that the sigma-delta analog-to-digital converter is configured as a differential converter, the two identical DACs receiving externally generated digital dither signals, and generating the at least one analog dither signal to comprise two identical analog dither signals that are feed to the pair of inputs of the amplifier; and wherein the switched-capacitor network comprises a double-sampled switched-capacitor structure.

22. The method according to claim 21, wherein the amplifier includes a pair of outputs; wherein the at least one switched-capacitor integrator comprises two identical feedback capacitors each connected between respective inputs and outputs of the amplifier; wherein the double-sampled switched-capacitor structure comprises four identical capacitors, a capacitance of which is half a capacitance of the feedback capacitors; and wherein each DAC comprises an array of binary weighted capacitors, a largest capacitance of the array of binary weighted capacitors being a fraction of the capacitance of the four identical capacitors.

23. The method according to claim 22, wherein the largest capacitance of the array of binary weighted capacitors is four times smaller than a capacitance of the four identical capacitors.

24. The method according to claim 22, wherein the sigma-delta analog-to-digital converter further comprises an input integrator distinct from the at least one switched-capacitor integrator; a double sampled bilinear switched capacitor network so that the sigma-delta analog-to-digital converter is configured as a second-order double-sampled analog-to-digital sigma-delta converter, the doubled sampled bilinear switched capacitor network including two pairs of differential inputs for receiving an analog differential input to be double-sampled, the method further comprising:
   generating a differential signal by the input integrator for forming the input signal to the switched-capacitor network of the at least one switched-capacitor integrator; and
   feeding an analog replica of a digital output of the converter to dedicated pairs of inputs of the input integrator for double-sampling the analog replica, the feeding based upon the sigma-delta analog-to-digital converter further comprising at least one negative feedback digital-to-analog converter.

* * * * *

UNITED STATES PATENT AND TRADEMARK OFFICE
CERTIFICATE OF CORRECTION

PATENT NO. : 7,304,592 B2  Page 1 of 1
APPLICATION NO. : 11/420592
DATED : December 4, 2007
INVENTOR(S) : Pinna et al.

It is certified that error appears in the above-identified patent and that said Letters Patent is hereby corrected as shown below:

Column 5, Line 31    Delete: "(OAC)"
Insert: -- (DAC) --

Signed and Sealed this

Second Day of June, 2009

JOHN DOLL
*Acting Director of the United States Patent and Trademark Office*